United States Patent
Motwani

(10) Patent No.: US 9,729,171 B2
(45) Date of Patent: Aug. 8, 2017

(54) TECHNIQUES FOR SOFT DECISION DECODING OF ENCODED DATA

(71) Applicant: Intel Corporation, Santa Clara, CA (US)

(72) Inventor: Ravi H. Motwani, San Diego, CA (US)

(73) Assignee: Intel Corporation, Santa Clara, CA (US)

(*) Notice: Subject to any disclaimer, the term of this patent is extended or adjusted under 35 U.S.C. 154(b) by 62 days.

(21) Appl. No.: 14/864,587

(22) Filed: Sep. 24, 2015

(65) Prior Publication Data

US 2017/0093439 A1 Mar. 30, 2017

(51) Int. Cl.
*H03M 13/00* (2006.01)
*G06F 11/00* (2006.01)
*H03M 13/11* (2006.01)
*H03M 13/45* (2006.01)
*G06F 11/10* (2006.01)
*G11C 29/52* (2006.01)

(52) U.S. Cl.
CPC ..... *H03M 13/1108* (2013.01); *G06F 11/1068* (2013.01); *G11C 29/52* (2013.01); *H03M 13/45* (2013.01); *H03M 13/6575* (2013.01)

(58) Field of Classification Search
CPC ............ G06F 11/1068; G06F 11/1072; H03M 13/1108; H03M 13/6575
See application file for complete search history.

(56) References Cited

U.S. PATENT DOCUMENTS

| 8,495,479 | B1* | 7/2013 | Varnica | H03M 13/1111 714/780 |
| 8,984,363 | B1* | 3/2015 | Juels | H04L 9/3221 714/752 |

\* cited by examiner

*Primary Examiner* — Shelly A Chase
(74) *Attorney, Agent, or Firm* — Compass IP Law PC

(57) ABSTRACT

Examples are given for techniques associated with error correction for encoded data. In some examples, error correction code (ECC) information for the ECC encoded data may be received that indicates the ECC encoded data has bit errors that are not able to be corrected by the ECC used to encode the ECC encoded data. A soft decision decoding may be implemented that includes flipping a given number of bits of a selected portion of the ECC encoded data based on a combinatorial operation or method. One or more successful decodes may result from this selective flipping to enable the ECC to successfully decode the ECC encoded data.

25 Claims, 9 Drawing Sheets

700

RECEIVE, AT CIRCUITRY FOR A MEMORY SYSTEM, ECC INFORMATION FOR ECC ENCODED DATA STORED IN THE MEMORY SYSTEM INDICATING A FAILURE TO CORRECT ONE OR MORE BIT ERRORS FROM A PLURALITY OF BIT ERRORS IN THE ECC ENCODED DATA
702

IDENTIFY A LOW CONFIDENCE PORTION OF THE ECC ENCODED DATA HAVING A LOWEST PROBABILITY OF HAVING ERROR FREE BITS COMPARED TO ONE OR MORE OTHER PORTIONS OF THE ECC ENCODED DATA, THE LOW CONFIDENCE PORTION INCLUDING r BITS
704

FLIP INDIVIDUAL BIT VALUES FOR k BITS OF THE r BITS INCLUDED IN THE LOW CONFIDENCE PORTION
706

DECODE THE ECC ENCODED DATA BASED ON A COMBINATORIAL OPERATION THAT RESULTS IN A PLURALITY OF SEPARATE DECODES OF THE ECC ENCODED DATA FOLLOWING THE FLIPPING OF THE INDIVIDUAL BIT VALUES FOR k BITS
708

DETERMINE THAT ONE OR MORE SEPARATE DECODES OF THE ECC ENCODED DATA WERE ABLE TO CORRECT THE PLURALITY OF BIT ERRORS AND IDENTIFY DECODED DATA FOR THESE ONE OR MORE SEPARATE DECODES AS ONE OR MORE SUCCESSFUL DECODES OF THE ECC ENCODED DATA
710

ADD THE ONE OR MORE SUCCESSFUL DECODES OF THE ECC ENCODED DATA TO A LIST
712

SELECTING A SUCCESSFUL DECODE OF THE ECC ENCODED DATA FROM THE LIST THAT HAS A CLOSEST HAMMING DISTANCE TO RECEIVED DATA FOR WHICH THE ECC ENCODED DATA WAS ENCODED
714

FIG. 7

*Storage Medium 800*

*Computer Executable Instructions for 700*

*FIG. 8*

TECHNIQUES FOR SOFT DECISION DECODING OF ENCODED DATA

BACKGROUND

An error correction code (ECC) may be used to protect data or recover from errors related to a medium via which the data was either transmitted or stored. For example, data may be encoded using an ECC to possibly recover from errors associated with wired/wireless communications, storage to memory devices/mediums or optical readers such as 2-dimensional bar code readers. ECC encoded data received by either reading data from a memory device/medium or barcode or received via a wired/wireless communication channel may be able to identify and correct up to a given number of errors. Typically, ECC encoded data may include codewords having a combination of data and redundant or parity bits or symbols. Depending on the size of a given codeword and the level of protection desired, codewords may vary in size and also may vary in the complexity of algorithms used to recover from possible errors.

Errors in a given period of time may be referred to as a bit error rate (BER) or raw bit error rate (RBER). Technological advances in digital signal transmissions that have greatly increased data transmission speeds have also increased the possibility of a higher BER or RBER. Also, memory storage/medium technologies have resulted in increasingly denser (e.g., higher storage capacity per memory device or die) storage that may also lead to an increased possibility of a higher RBER. In order to reduce the impacts of possibly higher RBERs, data may be encoded in larger codewords. However, these larger codewords may have more parity bits. Large codewords with more parity bits may require complex algorithms implemented with increasing amounts of computing resources and increased latency to correct bits errors.

BRIEF DESCRIPTION OF THE DRAWINGS

FIG. 7 illustrates an example logic flow.
FIG. 8 illustrates an example storage medium.

DETAILED DESCRIPTION

As contemplated in the present disclosure, large codewords with more parity bits may require complex algorithms implemented with increasing amounts of computing resources and latency in order to reduce RBERs. In some examples, users of memory storage technologies seek a balance between reducing RBERs yet minimizing latencies. Some memory storage technologies such as those associated with non-volatile memories may have relatively fast data access times but some characteristics of these non-volatile memories may lead to higher RBERs. Thus, relatively large codewords are used to protect data and counteract potentially higher RBERs but the aforementioned balance may limit just how large these codewords may be to protect the data.

Typically, dedicated decode circuitry may be provided to quickly decode ECC encoded data and correct detected bit errors to recover from a limited number of bit errors. These types of recovery techniques may be deemed as hard decision decodes. In some instances where detected bit errors exceed the limited number of bit errors that may be corrected via a hard decision decode ("hard decision decode failure"), an at least partially software-based technique may be implemented to correct a few additional bit errors beyond the limited number of bit errors. This at least partially software-based technique may be deemed as a soft decision decode. However, codewords and possibly short latency requirements make it difficult to determine how many additional bit errors may be corrected via a soft decision decode when a hard decision decode failure occurs. It is with respect to these and other challenges that the examples described herein are needed.

Figure 1:
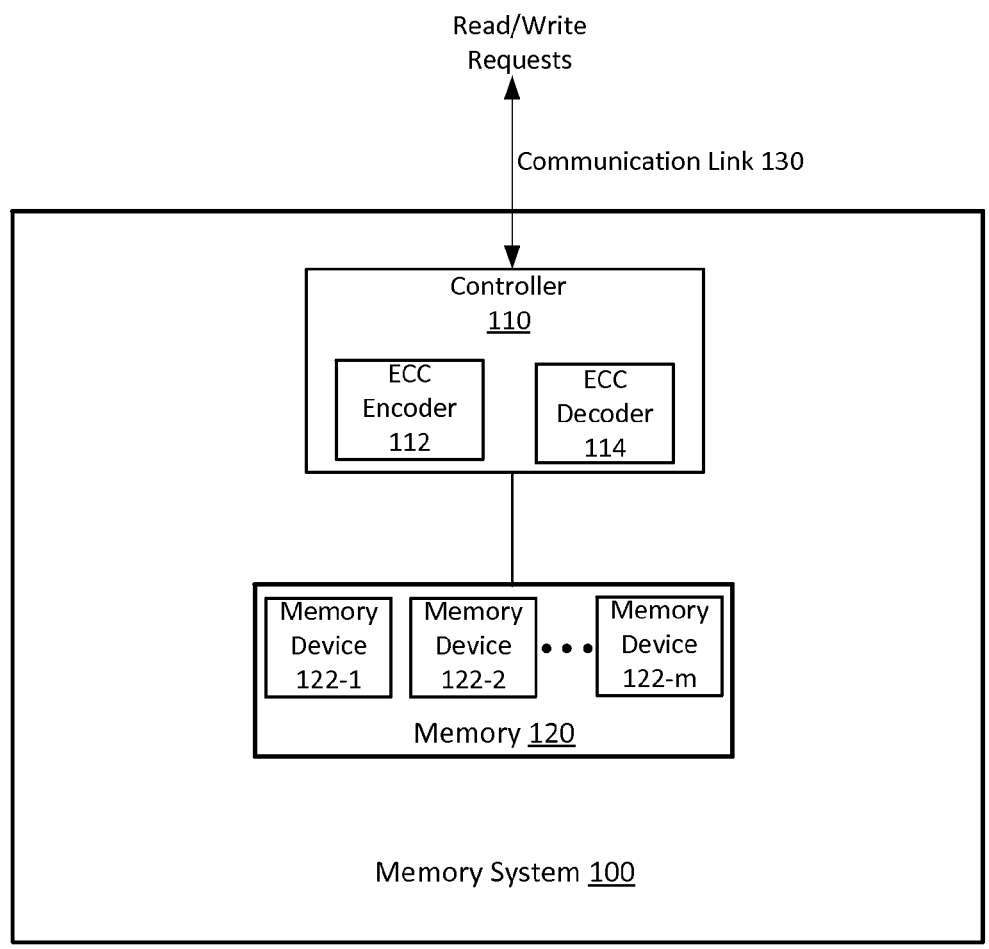
FIG. 1 illustrates an example memory system.

FIG. 1 illustrates an example memory system 100. As shown in FIG. 1, memory system 100 includes a controller 110 and a memory 120. According to some examples, controller 110 may receive and/or fulfill read/write requests via communication link 130. Although not shown in FIG. 1, in some examples, communication link 130 may communicatively couple controller 110 to elements or features associated with an operating system for a computing device. For these examples, memory system 100 may be a memory device for the computing device. As a memory device, memory system 100 may serve as a two level memory (2LM) system or a solid state drive (SSD) for the computing device.

In some examples, as shown in FIG. 1, controller 110 may include an error correction code (ECC) encoder 112 and an ECC decoder 114. ECC encoder 112 may include logic and/or features to generate codewords to protect data to be written to memory 120. As described in more detail below, ECC decoder 114 may include logic and/or features to detect, locate, possibly evaluate and correct errors included in ECC encoded data. According to some examples, the ECC used to encode the data may include, but is not limited to, Reed-Solomon (RS) codes or binary Bose, Chaudhuri, and Hocquenghem (BCH) codes.

In some examples, as shown in FIG. 1, memory 120 may include memory devices 120-1 to 120-$m$, where "m" is any positive whole integer>2. For these examples, memory devices 120-1 to 120-$m$ may include non-volatile and/or volatile types of memory. Non-volatile types of memory may include, but are not limited to 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or spin transfer torque—megnetorestive random access memory (STT-MRAM). Volatile types of memory may include, but are not limited to, dynamic random access memory (DRAM) or static RAM (SRAM).

In some examples, memory 120 may also include types of storage mediums such as optical discs to include, but not limited to, compact discs (CDs), digital versatile discs (DVDs), a high definition DVD (HD DVD) or a Blu-ray disc.

According to some examples where memory system 100 is configured as a 2LM system, memory system 100 may serve as main memory for a computing device. For these examples, memory 120 may include the two levels of memory including cached subsets of system level storage. In this configuration, the main memory may include "near memory" arranged to include volatile types on memory and "far memory" arranged to include volatile or non-volatile types of memory. The far memory may include volatile or non-volatile memory that may be larger and possibly slower than the volatile memory included in the near memory. The far memory may be presented as "main memory" to an operating system (OS) for the computing device while the near memory is a cache for the far memory that is transparent to the OS. The management of the 2LM system may be done by a combination of logic and modules executed via either controller 110 and/or processing circuitry (e.g., a CPU) for the computing device. Near memory may be coupled to the processing circuitry via high bandwidth, low latency means for efficient processing. Far memory may be coupled to the processing circuitry via low bandwidth, high latency means.

According to some examples, communications to or from controller 110 via communication link 130 may be routed through a Serial Advanced Technology Attachment (SATA) interface to service read/write requests. In another example, communications to or from controller 110 via communication link 130 may be routed through a Serial Attached Small Computer System Interface (SCSI) (or simply SAS) interface. In another example, communications to or from controller 110 via communication link 130 may be routed through a Peripheral Component Interconnect Express (PCIe) interface. In another example, communications to or from controller 110 via communication link 130 may be routed through a Non-Volatile Memory (NVM) Express interface.

Figure 2:
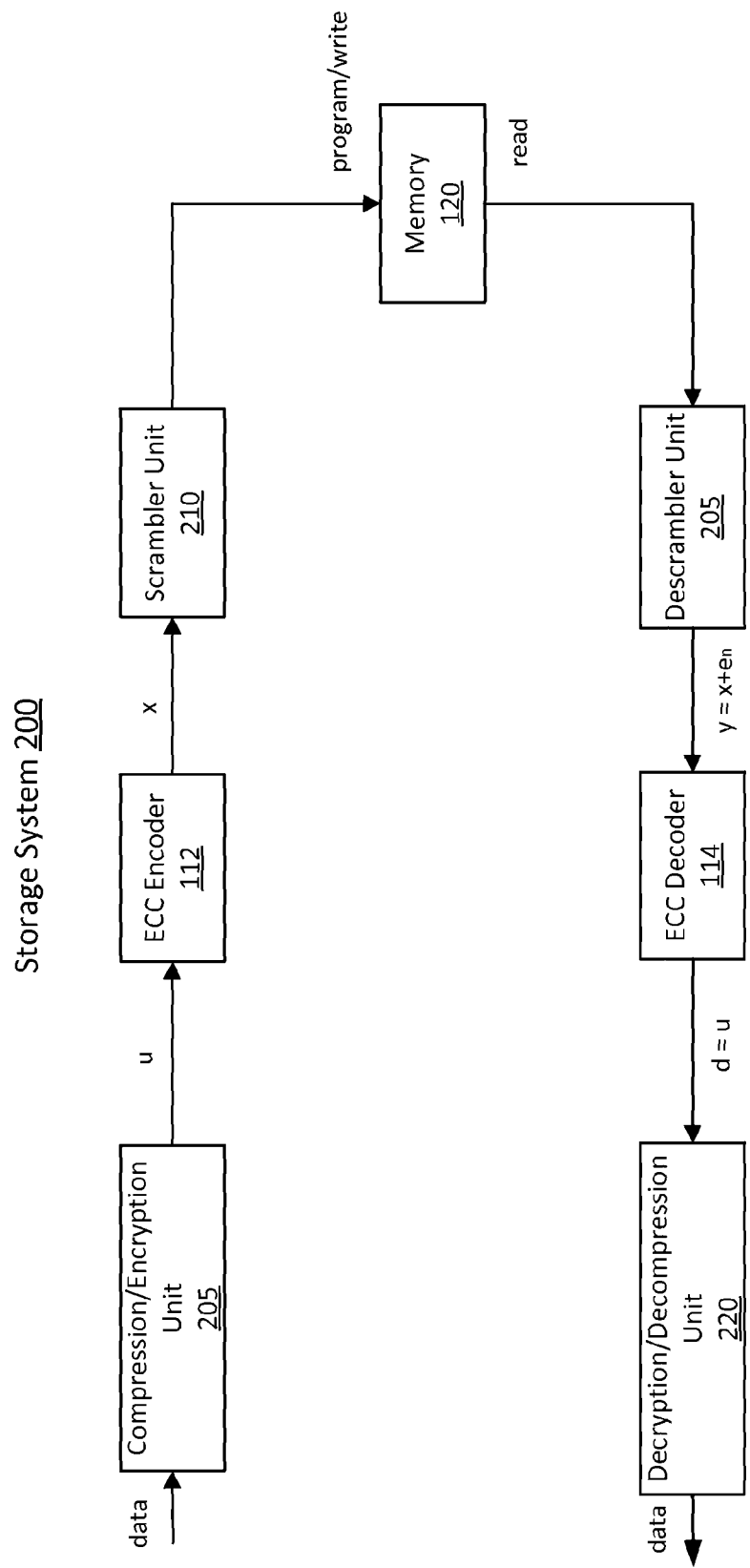
FIG. 2 illustrates an example storage system.

FIG. 2 illustrates an example storage system. In some examples, as shown in FIG. 2, storage system 200 includes a compression/encryption unit 205, ECC encoder 112, a scrambler unit 210, memory 120, a descrambler unit 205, ECC decoder 114 and a decryption/decompression unit 220.

According to some examples, as shown in FIG. 2, compression/encryption of data at compression/encryption unit 205 may result in "u". ECC encoder 112 may receive u and generate a codeword "x" using an ECC code (e.g., binary BCH or RS). Scrambler unit 210 may receive x and cause x to be programmed or written to memory 120. The codeword may be read from memory devices 122-1 to 122-m of memory 120 and descrambled by descrambler unit 205 to result in a codeword "y". As shown in FIG. 2, $y=x+e_n$, where "$e_n$" represents errors possibly introduced during the writing then reading of x from memory devices 122-1 to 122-m of memory 120 and "n" represents the number of errors introduced during the writes and reads from memory devices 122-1 to 122-m of memory 120. ECC decoder 114 may receive y and possibly correct identified errors to generate "d". As shown in FIG. 2, if the errors were correctable, d=u. Decryption/Decompression unit 220 may then decrypt/decompress u to generate data originally compressed/encrypted by compression/encryption unit 205.

In some examples, ECC decoder 114 may include logic and/or features to receive ECC information for ECC encoded data y having $e_n$. ECC decoder 114 may determine whether $e_n$ is a number of bit errors that exceeds the ECC's ability to correct. In other words, a hard decision decode failure has occurred. As described more below, logic and/or features of ECC decoder 114 may implement a soft decision decode technique to correct one or more bit errors included in $e_n$ to overcome the hard decision decode failure.

In some examples, ECC encoded data y having $e_n$ may have been encoded using an RS or BCH ECC. For example, a 320 byte (B) RS ECC may be used as part of a default proof of retrievability (POR) ECC scheme with a protection strength of 24 to protect from up to 24 bit errors for data stored to memory devices 122-1 to 122-m in cases with no die failure in these memory devices or a protection strength of 10 in cases of die failure. The lower protection strength of correcting up to 10 bit errors may be due to possible loss of parity information maintained in a memory device that has had a die failure.

In some examples, logic and/or features in the case of a die failure in one or more of memory devices 122-1 to 122-m may implement a soft decision decode technique to correct a given number of bits above 10 to overcome the die failure that may result in a hard decision decode failure. As described more below, the soft decision decode technique may include sorting portions of ECC encoded data y having $e_n$ based on their reliabilities (e.g., probability of having errors). A portion of ECC encoded data y having $e_n$ may be determined as having less reliability than another portion. A given number of bits may be flipped in this less reliable portion based on a combinatorial operation. The combinatorial operation may then result in a number of separate decodes of ECC encoded data y with some of the decodes resulting in ECC encoded data y having an $e_n$ with fewer bit errors than existed before bits were flipped. If after flipping of the given number of bits in the ECC encoded data y the "n" in $e_n$ falls to no more than 10, the POR ECC scheme with a protection of 10 bit errors may be able to correct the bit errors and this particular decode is deemed as a successful decode. Each successful decode may then be added to a list and a successful decode of ECC encoded data y having $e_n$ that has a closest Hamming distance to received data u before it was ECC encoded by ECC encoder 112 may be selected as d=u by logic and/or features of ECC decoder 114. In other words, the successful decode having the most bits that were corrected via flipping may be selected.

Although FIG. 2, depicts ECC encoded data having errors possibly caused by writing/reading data to memory 120. Other types of ECC encoded data such as ECC encoded data associated with wired/wireless communications or ECC encoded data associated with optical readers for 2-dimensional bar coder readers are also contemplated.

Figure 3:
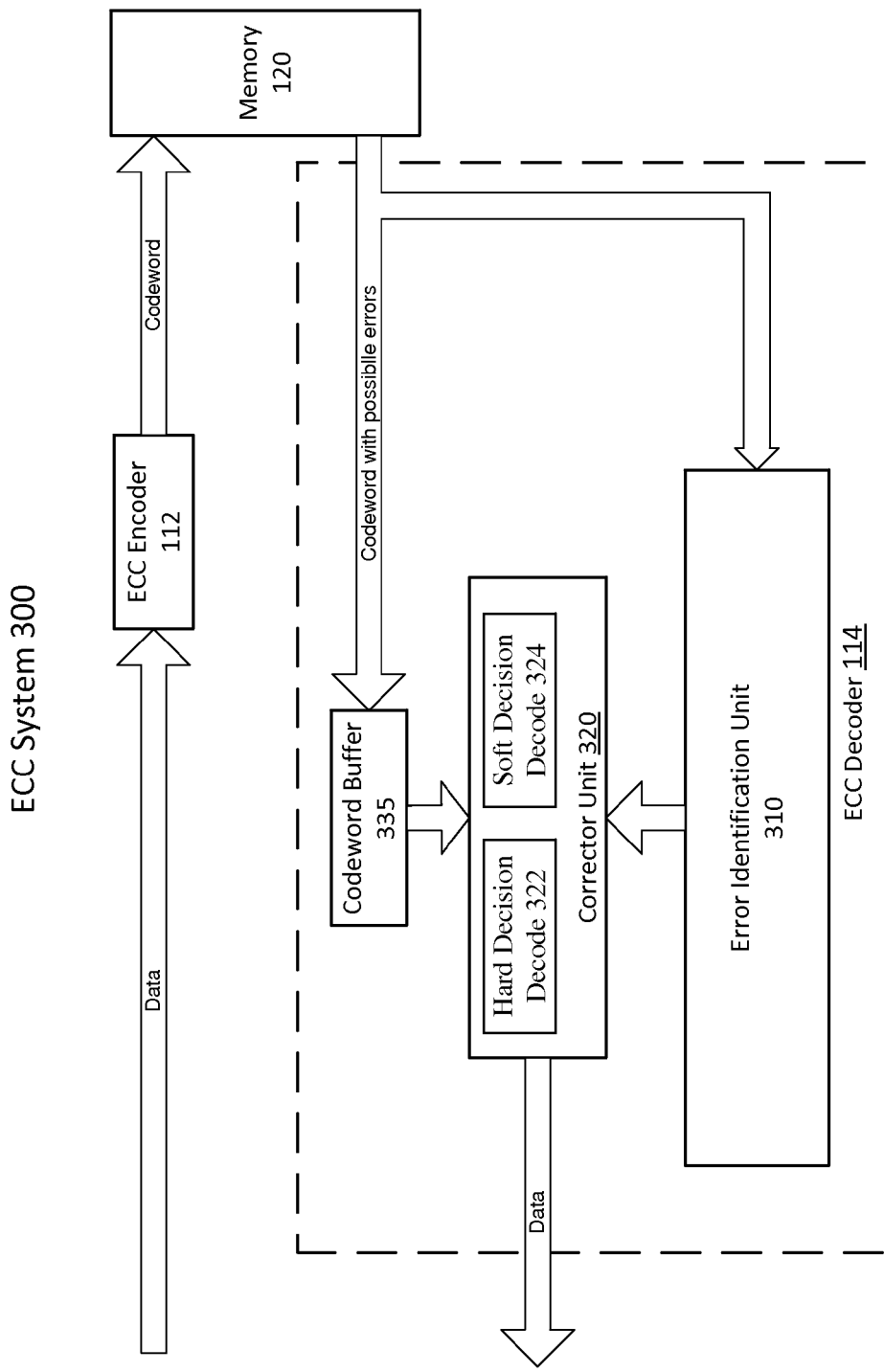
FIG. 3 illustrates an example error correction code (ECC) system.

FIG. 3 illustrates an example error correction code (ECC) system 300. In some examples, as shown in FIG. 3, ECC system 300 includes ECC encoder 112, memory 120 and ECC decoder 114. Also, ECC decoder 114 is shown as including an error identification unit 310, a corrector unit 320 and a codeword buffer 335.

In some examples, data (possibly encrypted/compressed) may be encoded by ECC encoder 112 using an ECC code that may include binary BCH codes or RS codes. The resultant codeword may then be stored to memory 120. According to some examples, the stored codeword may be read from memory 120 and may include possible errors. As shown in FIG. 3, the codeword with possible errors may be forwarded to codeword buffer 335. Codeword buffer 335 may be configured to at least temporarily store the codeword while other elements of ECC decoder 114 attempt to identify and correct each error possibly included in the codeword.

According to some examples, error identification unit 310 may be configured to determine if the codeword includes any errors and also if the number of errors in the codeword exceeds the ECC codes ability to correct those errors. For these examples, if no errors are detected, ECC decoder 114 may include logic and/or features to indicate to corrector unit 320 or codeword buffer 335 to forward the codeword being stored at codeword buffer 335. However, if errors are detected, error identification unit may then determine whether the number of errors in the codeword exceeds the ECC code's ability to correct the errors. If the number of errors does not exceed the ECC code's ability then circuitry and/or logic for hard decision decode 322 may be used at corrector unit 320 to correct the bit errors. If the number of errors does exceed the ECC code's ability then circuitry and/or logic for soft decision decode 324 may be used to attempt to reduce the number of bits errors to a level that the ECC code can correct the bit errors using the circuitry and/or logic for hard decision decode 322. Following a successful decode, corrector unit 325 may be configured to forward the data for possible decompression/decryption and eventual delivery to the source of the read request.

Figure 4:
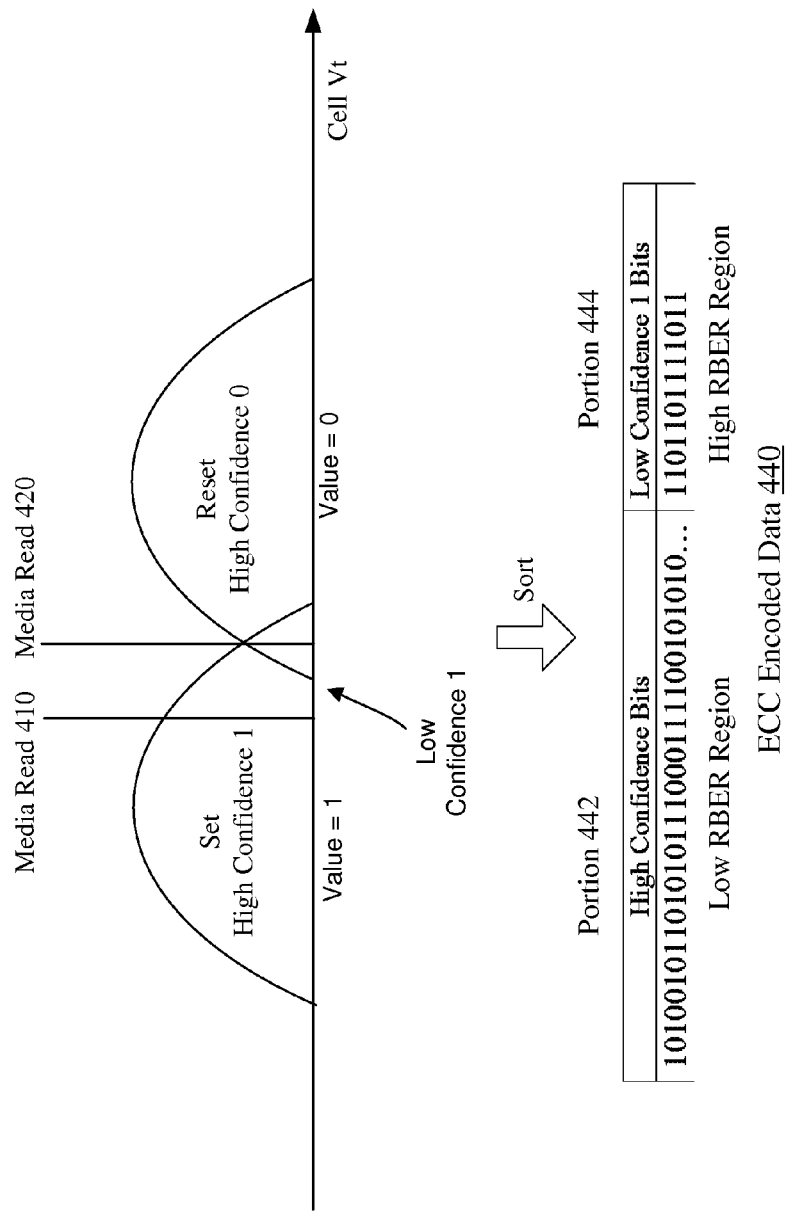
FIG. 4 illustrates an example confidence scheme.

FIG. 4 illustrates an example confidence scheme 400. In some examples, as shown in FIG. 4, confidence scheme 400 may include multiple media reads 410 and 420. Confidence scheme 400 may be part of a soft decision decoding implemented responsive to a hard decision decoding failure. In other words, ECC encoded data 440 may have more bits errors than can be corrected by the ECC for which received data was encoded and stored to a storage media such as a non-volatile memory. For these examples, media reads 410 and 420 may be at respective first and second read reference voltages for targeted non-volatile memory cells storing ECC encoded data 440 (e.g., for one or more memory devices) along the horizontal axis for a cell threshold voltage (Vt) for these targeted memory cells. As shown in FIG. 4, the area between media read 410 and media read 420 may be deemed as a low confidence 1. Low confidence 1 may represent a portion of ECC encoded data 440 having a lowest probability of having error free bits compared to one or more other portions of ECC encoded data 440. As shown in FIG. 4, the area on the Cell Vt axis between media read 410 and media read 420 is an area for a set value of 1 that may actually be a reset value of 0 and hence may have a higher probability of being identified as a bit error.

According to some examples, a sort 430 may be conducted as part of confidence scheme 400 that includes sorting bits from the media read 410 and media read 420 into high confidence bits included in portion 442 and low confidence 1 bits included in portion 444. For these examples, the high confidence bits included in portion 442 have high confidence bits from both set high confidence 1 and reset high confidence 0. The high confidence bits included in portion 442 may have a relatively lower RBER compared to the low confidence 1 bits included in portion 444.

In some examples, media read 410 and media read 420 may be set such that no more than "r" bits are included in portion 444 for ECC encoded data 440. As described more below, a decoding scheme may be implemented as part of soft decision decoding that determines the number of r bits based on requirements associated with quality of service (QoS) that may set a time threshold to correct bits errors in ECC encoded data before the bits errors in ECC encoded data 440 are deemed as uncorrectable.

Figure 5:
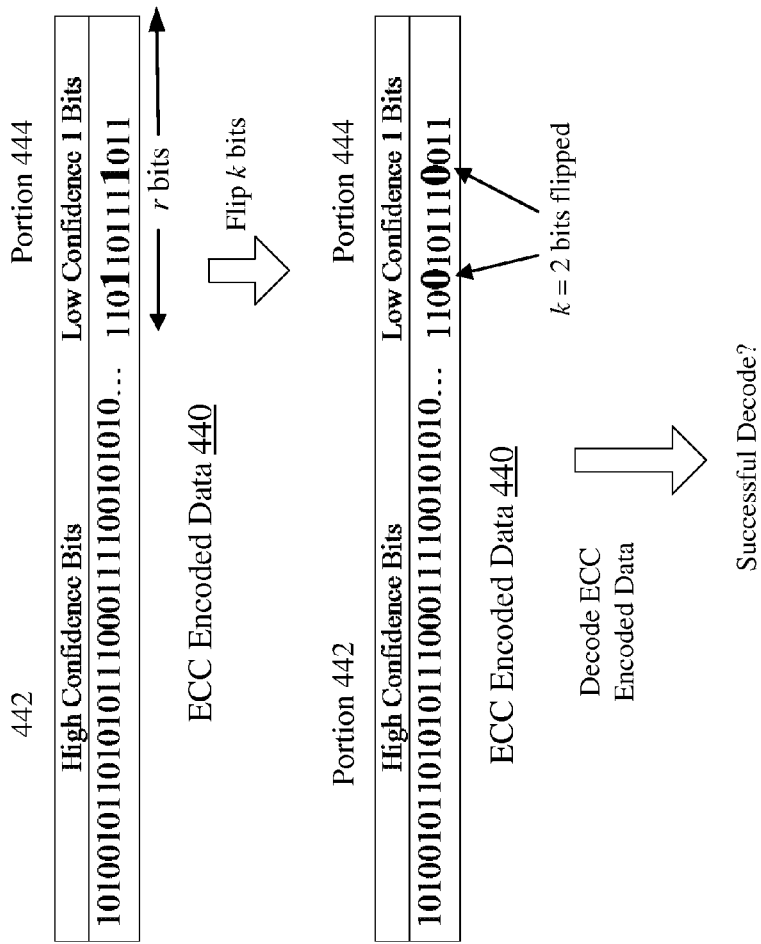
FIG. 5 illustrates an example decode scheme.

FIG. 5 illustrates an example decode scheme 500. In some examples, as shown in FIG. 5, decode scheme 500 includes flipping k bits of r bits included in portion 444. For the example decode scheme 500 shown in FIG. 5 k=2 and r=13. The value of k=2 may be based on a number of bits errors that could be corrected by the ECC via which ECC encoded data 440 was encoded. For example, if an RS ECC was used that protected up to 10 bit errors in ECC encoded data 440 then k=2 may be based on a total of 12 bit errors (12−10=2) being detected in ECC encoded data 440. So as shown in FIG. 5, a first decode may be implemented that flips 2 bits having a low confidence 1 value from portion 444 and then decodes ECC encoded data 440 to determine whether the flipped bits reduced the number of bit errors to 10 rather than 12. If the bit errors are reduced to 10 that decode may be deemed as successful.

According to some examples, the number of decodes to be assessed as to whether flipping of k bits from among r bits results in a successful decode following the flipping may be determined based on a combinatorial method or operation that results in in $$r + \frac{r!}{k!(r-k)!}$$

separate decodes. For the example shown in FIG. 5 with k=2 and r=13 the number of decodes would be $$13 + \frac{13!}{2!(13-2)!}$$

separate decodes that equates to approximately (13+78) or 91 separate decodes. In some examples, an RS ECC may have been used to decode ECC encoded data 440 as part of a 320B POR ECC scheme that has a protection strength of 10. For this example, a single decode using this 320B POR ECC scheme may take approximately 50 nanoseconds (ns) to complete. Thus, the 91 separate decodes may take a total of 4.55 microseconds (μsec) to complete. Examples are not limited to a 320B POR ECC scheme having 50 ns decodes times. Other, larger or smaller POR ECC schemes have longer or shorter decode times are contemplated.

According to some examples, one or more QoS requirements related to acceptable error correction latencies may set or establish a threshold time to complete $$r + \frac{r!}{k!(r-k)!}$$

separate decodes. For these examples, if these separate decodes are not expected to be completed within the threshold time, values for r and/or k may be adjusted. For example, if the threshold time was 4.5 μsec, the above-mentioned 4.55 μsec time to complete 91 separate decodes would exceed that time threshold. So adjusting r to a value of r=12 results in $$12 + \frac{12!}{2!(12-2)!} \text{ or } (12+66) \text{ or } 88$$

separate decodes. These 88 separate decodes may have an expected decode time of 4.5 μsec which now falls below the QoS time threshold.

In some examples, the QoS time threshold may be substantially higher than 4.5 μsec. For these examples, values for r and/or k may be adjusted to allow for more separate decodes. For example, the QoS time threshold may be up to 100 μsec. With a 50 ns decode time, up to 2000 separate decodes may be possible within this QoS time threshold. Thus if r was adjusted to a value of r=30 this results in $$30 + \frac{30!}{2!(30-2)!} \text{ or } (30+435) \text{ or } 465$$

separate decodes. These 465 separate decodes may have an expected decode time of around 23 μsec, which falls below the 100 μsec QoS time threshold. Also, if k were adjusted to a value of k=3 to correct more bit errors in these 30 bits, $$30 + \frac{30!}{3!(30-3)!} \text{ or } (30 + 4060) \text{ or } 4,095$$

separate decodes may be needed. This many decodes would exceed the 100 μsec QoS time threshold. So to keep a value of k=3 would require the value of r to be adjusted downward to a value of r=23. Values of k=3 and r=23 may result in $$23 + \frac{23!}{3!(23-3)!} \text{ or } (23 + 1771) \text{ or } 1,794$$

separate decodes having a total time of around 90 μsec, which now falls below the 100 μsec QoS time threshold.

According to some examples, more than one decode of $$r + \frac{r!}{k!(r-k)!}$$

separate decodes may result in a successful decode. In other words, for an example of r=30 and k=2, of the 465 decodes, at least two of these decodes were able to flip 2 bits that reduced ECC encoded data previously having 12 bit errors to now having 10 bit errors. As a result of reducing the bit errors to 10 bits, the POR ECC scheme having an ability to correct 10 bits may now successfully decode the ECC encoded data. For these examples, each successful decode may be added to a list and once the 465 decodes are completed, a successful decode of the ECC encoded data from the list that has a closest Hamming distance to received data for which the ECC encoded data was encoded is selected as the best representation of the received data that was stored in the memory cells.

Figure 6:
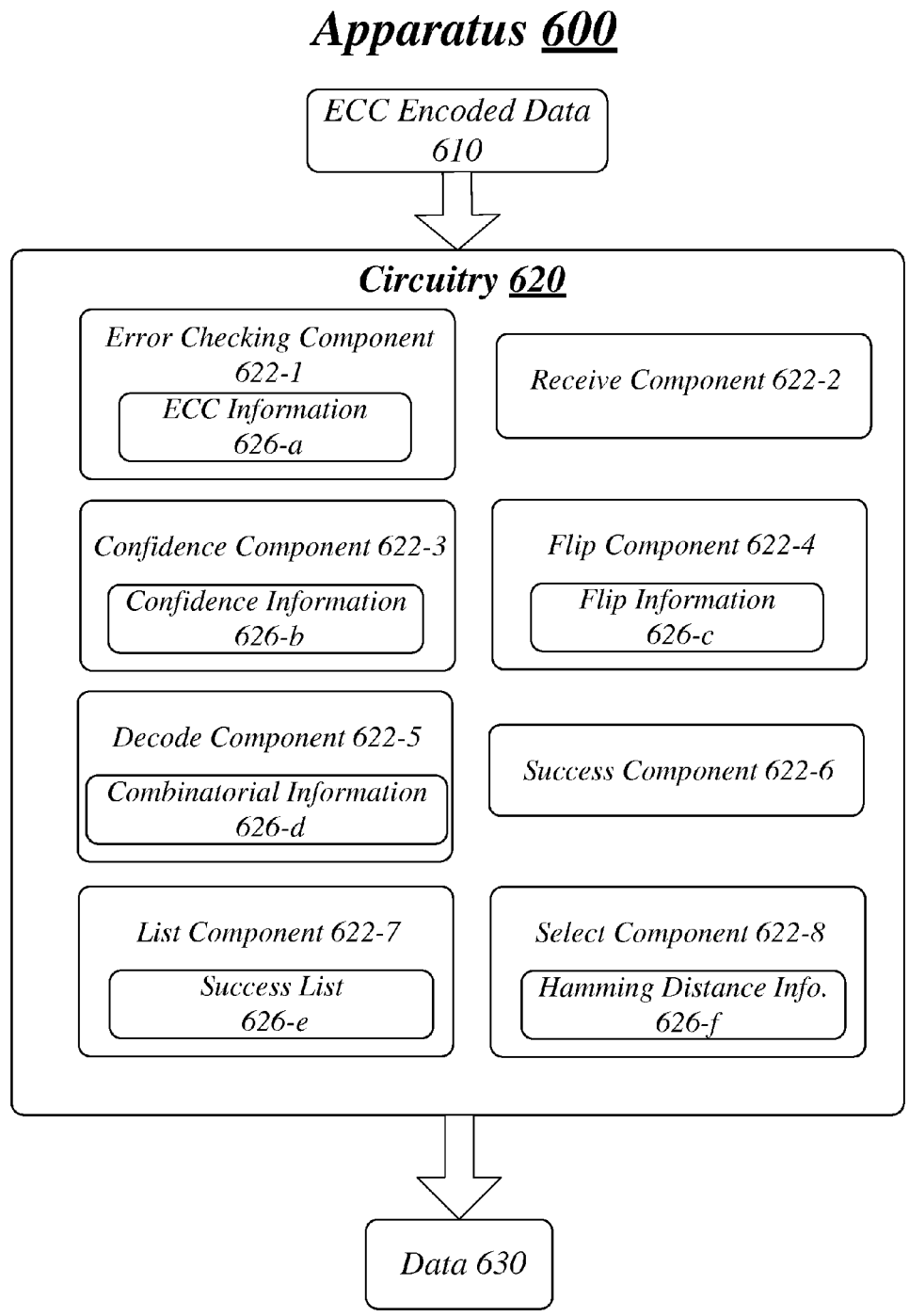
FIG. 6 illustrates an example apparatus.

FIG. 6 illustrates an example apparatus 600. Although the apparatus 600 shown in FIG. 6 has a limited number of elements in a certain topology, it may be appreciated that the apparatus 600 may include more or less elements in alternate topologies as desired for a given implementation.

The apparatus 600 may be supported by circuitry 620 that may execute at least some of the logic and/or features mentioned above for an ECC decoder such as ECC decoder 114 mentioned above for at least FIGS. 1-5. Circuitry 620 may be arranged to execute one or more software or firmware implemented components 622-a. It is worthy to note that "a" and "b" and "c" and similar designators as used herein are intended to be variables representing any positive integer. Thus, for example, if an implementation sets a value for a=8, then a complete set of software or firmware components 622-a may include modules 622-1, 622-2, 622-3, 622-4, 622-5, 622-6, 622-7 or 622-8. The examples presented are not limited in this context and the different variables used throughout may represent the same or different integer values.

According to some examples, apparatus 600 may be capable of being located with a controller or ECC decoder for a memory system, e.g., as part of a memory system such as memory system 100. For these examples, apparatus 600 may be included in or implemented by circuitry 620 to include a processor, processor circuitry, microcontroller circuitry, an application-specific integrated circuit (ASIC) or a field programmable gate array (FPGA). In other examples, apparatus 600 may be implemented by circuitry 620 as part of firmware (e.g., BIOS), or implemented by circuitry 620 as a middleware application. The examples are not limited in this context.

In some examples, if implemented in a processor, the processor may be generally arranged to execute one or more software components 622-a. The processor can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. Multi-core processors and other multi-processor architectures may also be employed to implement apparatus 600.

According to some examples, apparatus 600 may include an error checking component 622-1. Error checking component 622-1 may be executed by circuitry 620 to determine that ECC encoded data stored in a memory system has a plurality of bit errors and then generate ECC information to indicate the failure to correct one or more bit errors from a plurality of bit errors in the ECC encoded data. For these examples, the plurality of bit errors may be detected while checking ECC encoded data 610 for bit errors. That check may uncover more bits errors than the ECC's ability to correct. For example, an RS ECC having an ability to correct up to 10 bit errors may be used to encode ECC encoded data 610 and error checking component 622-1 may determine that plurality of bit errors in ECC encoded data 610 exceeds 10 bit errors. Error checking component 622-1 may maintain information related to this exceeding of 10 bits errors with ECC information 626-a (e.g., maintained in a look up table (LUT).

In some examples, apparatus 600 may also include a receive component 622-2. Receive component 622-2 may be executed by circuitry 620 to receive the ECC information for the ECC encoded data stored in the memory system. For these examples, the information may be received from error checking component 622-1 and may indicate a failure of the ECC to correct one or more bit errors from the plurality of bit errors in the ECC encoded data.

In some examples, apparatus 600 may also include a confidence component 622-3. Confidence component 622-3 may be executed by circuitry 620 to identify a low confidence portion of the ECC encoded data that has a lowest probability of error free bits compared to one or more other portions of the ECC encoded data, the low confidence portion to include r bits. For these examples, confidence component 622-3 may identify the low confidence portion of the ECC encoded data by implementing a first media read of the ECC encoded data at a first reference voltage, implementing a second media read of the ECC encoded data at a second reference voltage, sorting bits from the first and second media reads of the ECC encoded data based on a probability of having an error and placing r bits having the lowest probability of having error free bits in the low confidence portion of the ECC encoded data. Confidence component 622-3 may maintain confidence information 626-b (e.g., in a LUT) to hold information related to this sorting of bits from the first and second media reads.

In some examples, apparatus 600 may also include a flip component 622-4. Flip component 622-4 may be executed by circuitry 620 to flip individual bit values for k bits of the r bits included in the low confidence portion. For these examples, flip component 622-4 may maintain flip information 626-c (e.g., in a LUT) to track which bits have been flipped.

According some examples, apparatus 600 may also include a decode component 622-5. Decode component 622-5 may be executed by circuitry 620 to cause the ECC encoded data to be decoded based on a combinatorial operation that may result in $$r + \frac{r!}{k!(r-k)!}$$

separate decodes of the ECC encoded data following the flip of the individual bit values for k bits. For these examples, decode component 622-5 may maintain combinatorial information 626-d (e.g., in a LUT) to determine the number of separate decodes needed based on values for r and k.

In some examples, apparatus 600 may also include a success component 622-6. Success component 622-6 may be executed by circuitry 620 to determine that one or more separate decodes of the ECC encoded data were able to correct the plurality of bit errors and identify decoded data for these one or more separate decodes as one or more successful decodes of the ECC encoded data. For these examples, a successful decode may be based on whether the ECC encoded data was able to correct errors following flipping of bits by flip component 622-4.

According some examples, apparatus 600 may also include a list component 622-7. List component 622-7 may be executed by circuitry 620 to add the one or more successful decodes of the ECC encoded data to a list. For these examples, the list may be included in success list 626-e maintained by list component 622-7 (e.g., in a LUT).

In some examples, apparatus 600 may also include a select component 622-8. Select component 622-8 may be executed by circuitry 620 to select a successful decode of the ECC encoded data from the list that has a closest Hamming distance to received data for which the ECC encoded data was encoded. Data 630 may include data from this selected successful decode. For these examples, select component 622-8 may maintain hamming distance information 626-f (e.g., in a LUT) that includes information related to comparison of the successful decodes compiled by list component 622-7 to received data encoded by the ECC used to protect the data. The Hamming distance may only be applicable if more than 1 bit error is being corrected above the level at which the ECC failed to correct the plurality of bits. For example, if the ECC protected up to 10 bit errors and the plurality of bit errors was found to be 12 bit errors by error checking component 622-1, by the flipping k bits of r bits when the value for k=2, all successful decodes would have equal Hamming distances. However, if value for k=3, successful decodes having 2 or 3 correctly flipped bits to correct a bit error would have different Hamming distances. The different Hamming distances would result as the 3 correctly flipped bits that resulted in successful decodes would have closer Hamming distances than the 2 correctly flipped bits that also resulted in successful decodes.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 7 illustrates a logic flow 700. Logic flow 700 may be representative of some or all of the operations executed by one or more logic, features, or devices described herein, such as apparatus 600. More particularly, logic flow 700 may be implemented by receive component 622-2, confidence component 622-3, flip component 622-4, decode component 622-5, success component 622-6, list component 622-7 or select component 622-8.

According to some examples, logic flow 700 at block 702 may receive, at circuitry for a memory system, ECC information for ECC encoded data stored in the memory system indicating a failure to correct one or more bit errors from a plurality of bit errors in the ECC encoded data. For these examples, receive component 622-2 may receive the ECC information.

In some examples, logic flow 700 at block 704 may identify a low confidence portion of the ECC encoded data having a lowest probability of having error free bits compared to one or more other portions of the ECC encoded data, the low confidence portion including r bits. For these examples, confidence component may identify the low confidence portion.

According to some examples, logic flow 700 at block 706 may flip individual bit values for k bits of the r bits included in the low confidence portion. For these examples, flip component 622-4 may flip the individual bit values.

In some examples, logic flow 700 at block 708 may decode the ECC encoded data based on a combinatorial operation that results in a plurality of separate decodes of the ECC encoded data following the flipping of the individual bit values for k bits. For these examples, decode component 622-5 may decode the ECC encoded data following the flipping of the individual bit values for k bits. Also, the plurality of separate decodes may be determined to be $$r + \frac{r!}{k!(r-k)!}$$

separate decodes.

According to some examples, logic flow 700 at block 710 may determine that one or more separate decodes of the ECC encoded data were able to correct the plurality of bit errors and identify decoded data for these one or more separate decodes as one or more successful decodes of the ECC encoded data. For these examples, success component 622-8 may make this determination.

According to some examples, logic flow 700 at block 712 may add the one or more successful decodes of the ECC encoded data to a list. For these examples, list component 622-7 may add the one or more successful decodes to the list.

In some examples, logic flow 700 at block 714 may select a successful decode of the ECC encoded data from the list that has a closest Hamming distance to received data for which the ECC encoded data was encoded. For these examples, select component 622-8 may select the successful decode that has the closest Hamming distance (if applicable).

FIG. 8 illustrates an embodiment of a storage medium 800. The storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
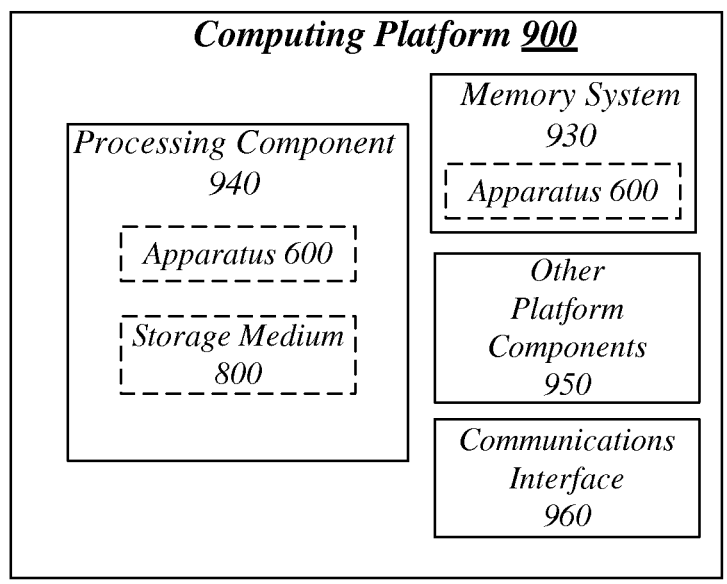
FIG. 9 illustrates an example computing platform.

FIG. 9 illustrates an example computing platform 900. In some examples, as shown in FIG. 9, computing platform 900 may include a memory system 930, a processing component 940, other platform components 950 or a communications interface 960. According to some examples, computing platform 900 may be implemented in a computing device.

According to some examples, memory system 930 may be similar to memory system 100. For these examples, logic and/or features (e.g., included in an ECC decoder/controller) resident at or located with memory system 930 may execute at least some processing operations or logic for apparatus 600. Also, memory system 930 may include volatile or non-volatile types of memory (not shown) that may store ECC encoded data written to or read from in a similar manner as described above for memory 120 included in memory system 100.

According to some examples, processing component 940 may also execute at least some processing operations or logic for apparatus 600 and/or storage medium 800. Processing component 940 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 950 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 950 or memory system 930 may include without limitation, various types of computer readable and machine readable storage media in the form of one or more higher speed memory units, such as read-only memory (ROM), RAM, DRAM, Double-Data-Rate DRAM (DDRAM), synchronous DRAM (SDRAM), SRAM, programmable ROM (PROM), erasable programmable ROM (EPROM), electrically erasable programmable ROM (EEPROM), flash memory, nanowires, ferroelectric transistor random access memory (FeTRAM or FeRAM), polymer memory such as ferroelectric polymer memory, ovonic memory, 3-dimensional cross-point memory or ferroelectric memory, silicon-oxide-nitride-oxide-silicon (SONOS) memory, nanowire, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 960 may include logic and/or features to support a communication interface. For these examples, communications interface 960 may include one or more communication interfaces that operate according to various communication protocols or standards to communicate over direct or network communication links. Direct communications may occur via use of communication protocols or standards described in one or more industry standards (including progenies and variants) such as those associated with the System Management Bus (SMBus) specification, the PCI Express (PCIe) specification, the Non-Volatile Memory Express (NVMe) specification, the Serial Advanced Technology Attachment (SATA) specification, Serial Attached SCSI (SAS) or the Universal Serial Bus (USB) specification. Network communications may occur via use of communication protocols or standards such those described in one or more Ethernet standards promulgated by the Institute of Electrical and Electronics Engineers (IEEE). For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 900 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 900 described herein, may be included or omitted in various embodiments of computing platform 900, as suitably desired.

The components and features of computing platform 900 may be implemented using any combination of discrete circuitry, application specific integrated circuits (ASICs), logic gates and/or single chip architectures. Further, the features of computing platform 900 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include circuitry for a memory system. The apparatus may also include a receive component for execution by the circuitry to receive ECC information for ECC encoded data stored in the memory system that indicates a failure to correct one or more bit errors from a plurality of bit errors in the ECC encoded data. The apparatus may also include a confidence component for execution by the circuitry to identify a low confidence portion of the ECC encoded data that has a lowest probability of error free bits compared to one or more other portions of the ECC encoded data, the low confidence portion to include r bits. The apparatus may also include a flip component for execution by the circuitry to flip individual bit values for k bits of the r bits included in the low confidence portion. The apparatus may also include a decode component for execution by the circuitry to cause the ECC encoded data to be decoded based on a combinatorial operation that results in a plurality of separate decodes of the ECC encoded data following the flip of the individual bit values for k bits. The apparatus may also include a success component for execution by the circuitry to determine that one or more separate decodes of the ECC encoded data were able to correct the plurality of bit errors and identify decoded data for these one or more separate decodes as one or more successful decodes of the ECC encoded data.

Example 2

The apparatus of example 1, the combinatorial operation that results in the plurality of separate decodes may include the combinatorial operation to result in $$r + \frac{r!}{k!(r-k)!}$$

separate decodes.

Example 3

The apparatus of example 1 may also include a list component for execution by the circuitry to add the one or more successful decodes of the ECC encoded data to a list. The apparatus may also include a select component for execution by the circuitry to select a successful decode of the ECC encoded data from the list that has a closest Hamming distance to received data for which the ECC encoded data was encoded.

Example 4

The apparatus of example 1 may also include an error checking component for execution by the circuitry to determine that the ECC encoded data has the plurality of bit errors and generate the ECC information to indicate the failure to correct one or more bit errors from the plurality of bit errors in the ECC encoded data.

Example 5

The apparatus of example 4, the failure to correct one or more bit errors from the plurality of bit errors in the ECC encoded data may include the failure responsive to a die failure for a memory device in the memory system for which the ECC encoded data is stored in.

Example 6

The apparatus of example 4, the plurality of bits errors in the ECC encoded data may be greater than 10 bits, where 10 bits is a number of bit errors an ECC used to encode the ECC encoded data is able to correct in the ECC encoded data.

Example 7

The apparatus of example 1, an ECC used to encode the ECC encoded data may include one of a RS code or a BCH code.

Example 8

The apparatus of example 1, r bits may be determined by the confidence component based on an amount of time for the flip component to flip individual bit values for k bits and the decode component may cause the plurality of separate decodes of the ECC encoded data to be decoded following the flip by the flip component is less than a threshold time.

Example 9

The apparatus of example 8, the threshold time may be based on a QoS requirement that includes time to correct bit errors before the plurality of bit errors in the ECC encoded data are deemed uncorrectable.

Example 10

The apparatus of example 1, the memory system may include non-volatile or volatile types of memory.

Example 11

The apparatus of example 10, the volatile types of memory comprises DRAM.

Example 12

The apparatus of example 10, the non-volatile types of memory may include 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or spin transfer torque—megnetorestive random access memory (STT-MRAM).

Example 13

The apparatus of example 12, the confidence component to identify the low confidence portion of the ECC encoded data may include the confidence component to implement a first media read of the ECC encoded data at a first reference voltage. Identify the low confidence portion may also include the confidence component to implement a second media read of the ECC encoded data at a second reference voltage. Identify the low confidence portion may also include the confidence component to sort bits from the first and second media reads of the ECC encoded data based on probability of having an error and place r bits having the lowest probability of having error free bits in the low confidence portion of the ECC encoded data.

Example 14

An example method may include receiving, at circuitry for a memory system, ECC information for ECC encoded data stored in the memory system indicating a failure to correct one or more bit errors from a plurality of bit errors in the ECC encoded data. The method may also include identifying a low confidence portion of the ECC encoded data having a lowest probability of having error free bits compared to one or more other portions of the ECC encoded data, the low confidence portion including r bits. The method may also include flipping individual bit values for k bits of the r bits included in the low confidence portion. The method may also include decoding the ECC encoded data based on a combinatorial operation that results in a plurality of separate decodes of the ECC encoded data following the flipping of the individual bit values for k bits. The method may also include determining that one or more separate decodes of the ECC encoded data were able to correct the plurality of bit errors and identifying decoded data for these one or more separate decodes as one or more successful decodes of the ECC encoded data.

Example 15

The method of example 14, the combinatorial operation that results in the plurality of separate decodes may include the combinatorial operation to result in $$r + \frac{r!}{k!(r-k)!}$$

separate decodes.

Example 16

The method of example 14 may also include adding the one or more successful decodes of the ECC encoded data to a list. The method may also include selecting a successful decode of the ECC encoded data from the list that has a closest Hamming distance to received data for which the ECC encoded data was encoded.

Example 17

The method of example 14, an ECC used to encode the ECC encoded data may include one of a RS code or a BCH code.

Example 18

The method of example 14, the failure to correct one or more bit errors from the plurality of bit errors in the ECC encoded data may include the failure responsive to a die failure for a memory device in the memory system for which the ECC encoded data is stored in.

Example 19

The method of example 18, the plurality of bits errors in the ECC encoded data may be greater than 10 bits, where 10 bits is a number of bit errors an ECC used to encode the ECC encoded data is able to correct in the ECC encoded data.

Example 20

The method of example 14, r bits may be determined based on an amount of time to flip individual bit values for k bits and decode the separate decodes of the ECC encoded data following the flip being less than a threshold time.

Example 21

The method of example 20, the threshold time may be based on a QoS requirement that includes time to correct bit errors before deeming the plurality of bit errors in the ECC encoded data uncorrectable.

Example 22

The method of example 15, the memory system may include non-volatile or volatile types of memory.

Example 23

The method of example 22, the volatile types of memory may include DRAM.

Example 24

The method of example 22, the non-volatile types of memory may include 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or spin transfer torque—megnetorestive random access memory (STT-MRAM).

Example 25

The method of example 24, identifying the low confidence portion of the ECC encoded data may include implementing a first media read of the ECC encoded data at a first reference voltage. Identifying the low confidence portion may also include implementing a second media read of the ECC encoded data at a second reference voltage. Identifying the low confidence portion may also include sorting bits from the first and second media reads of the ECC encoded data based on probability of having an error and placing r bits having the lowest probability of having error free bits in the low confidence portion of the ECC encoded data.

Example 26

An example at least one machine readable medium may include a plurality of instructions that in response to being executed by a system may cause the system to carry out a method according to any one of examples 14 to 25.

Example 27

An example apparatus may include means for performing the methods of any one of examples 14 to 25.

Example 28

An example system may include one or more memory devices to store ECC encoded data. The system may also include a controller. The controller may include circuitry arranged to execute logic. The logic may receive ECC information for ECC encoded data stored in the one or more memory devices. The ECC information may indicate that a failure to correct one or more bit errors from a plurality of bit errors in the ECC encoded data. The logic may also identify a low confidence portion of the ECC encoded data that has a lowest probability of error free bits compared to one or more other portions of the ECC encoded data, the low confidence portion to include r bits. The logic may also flip individual bit values for k bits of the r bits included in the low confidence portion. The logic may also cause the ECC encoded data to be decoded based on a combinatorial operation that results in a plurality of separate decodes of the ECC encoded data following the flip of the individual bit values for k bits. The logic may also determine that one or more separate decodes of the ECC encoded data were able to correct the plurality of bit errors and identify decoded data for these one or more separate decodes as one or more successful decodes of the ECC encoded data.

Example 29

The system of example 28, the combinatorial operation that results in the plurality of separate decodes may include the combinatorial operation to result in $$r + \frac{r!}{k!(r-k)!}$$

separate decodes.

Example 30

The system of example 28, the logic may also add the one or more successful decodes of the ECC encoded data to a list. The logic may also select a successful decode of the ECC encoded data from the list that has a closest Hamming distance to received data for which the ECC encoded data was encoded.

Example 31

The system of example 28, the logic may also determine that the ECC encoded data has the plurality of bit errors and may generate the ECC information to indicate the failure to correct one or more bit errors from the plurality of bit errors in the ECC encoded data.

Example 32

The system of example 28, the failure to correct one or more bit errors from the plurality of bit errors in the ECC encoded data may include the failure responsive to a die failure for at least one of the one or more memory devices for which the ECC encoded data is stored in.

Example 33

The system of example 32, the plurality of bits errors in the ECC encoded data may be greater than 10 bits, where 10 bits is a number of bit errors an ECC used to encode the ECC encoded data is able to correct in the ECC encoded data.

Example 34

The system of example 29, an ECC used to encode the ECC encoded data may include one of a RS code or a BCH code.

Example 35

The system of example 28, r bits may be determined based on an amount of time to flip individual bit values for k bits and to cause the separate decodes of the ECC encoded data to be decoded following the flip by the flip is less than a threshold time.

Example 36

The system of example 35, the threshold time may be based on a QoS requirement that includes time to correct bit errors before the plurality of bit errors in the ECC encoded data are deemed uncorrectable.

Example 37

The system of example 28, the one or more memory devices may include non-volatile or volatile types of memory.

Example 38

The system of example 37, the volatile types of memory may include DRAM.

Example 39

The system of example 37, the non-volatile types of memory may include 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or spin transfer torque—megnetorestive random access memory (STT-MRAM).

Example 40

The system of example 39, the logic to identify the low confidence portion of the ECC encoded data may include the logic to implement a first media read of the ECC encoded data at a first reference voltage. The logic may also implement a second media read of the ECC encoded data at a second reference voltage. The logic may also sort bits from the first and second media reads of the ECC encoded data based on probability of having an error and place r bits having the lowest probability of having error free bits in the low confidence portion of the ECC encoded data.

Example 41

An example at least one machine readable medium may include a plurality of instructions that in response to being executed by a system coupled with one or more memory devices may cause the system to receive ECC information for ECC encoded data stored in the one or more memory devices. The ECC information may indicate that a failure to correct one or more bit errors from a plurality of bit errors in the ECC encoded data. The instructions may also cause the system to identify a low confidence portion of the ECC encoded data that has a lowest probability of error free bits compared to one or more other portions of the ECC encoded data, the low confidence portion to include r bits. The instructions may also cause the system to flip individual bit values for k bits of the r bits included in the low confidence portion. The instructions may also cause the system to cause the ECC encoded data to be decoded based on a combinatorial operation that results in a plurality of separate decodes of the ECC encoded data following the flip of the individual bit values for k bits. The instructions may also cause the system to determine that one or more separate decodes of the ECC encoded data were able to correct the plurality of bit errors and identify decoded data for these one or more separate decodes as one or more successful decodes of the ECC encoded data.

Example 42

The at least one machine readable medium of example 41, the combinatorial operation that results in the plurality of separate decodes may include the combinatorial operation to result in $$r + \frac{r!}{k!(r-k)!}$$

separate decodes.

Example 43

The at least one machine readable medium of example 41, the instructions may further cause the system to add the one or more successful decodes of the ECC encoded data to a list and select a successful decode of the ECC encoded data from the list that has a closest Hamming distance to received data for which the ECC encoded data was encoded.

Example 44

The at least one machine readable medium of example 41, the instructions may further cause the system to determine that the ECC encoded data has the plurality of bit errors and generate the ECC information to indicate the failure to correct one or more bit errors from the plurality of bit errors in the ECC encoded data.

Example 45

The at least one machine readable medium of example 44, the failure to correct one or more bit errors from the plurality of bit errors in the ECC encoded data may include the failure responsive to a die failure for at least one of the one or more memory devices for which the ECC encoded data is stored in.

Example 46

The at least one machine readable medium of example 45, the plurality of bits errors in the ECC encoded data may be greater than 10 bits, where 10 bits is a number of bit errors an ECC used to encode the ECC encoded data is able to correct in the ECC encoded data.

Example 47

The at least one machine readable medium of example 41, an ECC used to encode the ECC encoded data may include one of a RS code or a BCH code.

Example 48

The at least one machine readable medium of example 41, r bits may be determined based on an amount of time to flip individual bit values for k bits and to cause the separate decodes of the ECC encoded data to be decoded following the flip is less than a threshold time.

Example 49

The at least one machine readable medium of example 44, the threshold time may be based on a QoS requirement that includes time to correct bit errors before the plurality of bit errors in the ECC encoded data are deemed uncorrectable.

Example 50

The at least one machine readable medium of example 41, the one or more memory devices may include non-volatile or volatile types of memory.

Example 51

The at least one machine readable medium of example 50, the volatile types of memory may include DRAM.

Example 52

The at least one machine readable medium of example 50, the non-volatile types of memory may include 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or spin transfer torque—megnetorestive random access memory (STT-MRAM).

Example 53

The at least one machine readable medium of example 52, the instructions to cause the system to identify the low confidence portion of the ECC encoded data may also include the instructions to cause the system to implement a first media read of the ECC encoded data at a first reference voltage. The system may also implement a second media read of the ECC encoded data at a second reference voltage. The system may also sort bits from the first and second media reads of the ECC encoded data based on probability of having an error. The system may also place r bits having the lowest probability of having error free bits in the low confidence portion of the ECC encoded data.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
    a communication link; and
    a controller to receive read or write commands for a memory system via the communication link, the controller to execute logic, at least a portion of which is in hardware, the logic to:
    receive error correction code (ECC) information for ECC encoded data stored in the memory system that indicates a failure to correct one or more bit errors from a plurality of bit errors in the ECC encoded data;
    identify a low confidence portion of the ECC encoded data that has a lowest probability of error free bits compared to one or more other portions of the ECC encoded data, the low confidence portion to include r bits;
    flip individual bit values for k bits of the r bits included in the low confidence portion;
    cause the ECC encoded data to be decoded based on a combinatorial operation that results in a plurality of separate decodes of the ECC encoded data following the flip of the individual bit values for k bits; and
    determine that one or more separate decodes of the ECC encoded data were able to correct the plurality of bit errors and identify decoded data for these one or more separate decodes as one or more successful decodes of the ECC encoded data.

2. The apparatus of claim 1, the combinatorial operation that results in the plurality of separate decodes comprises the combinatorial operation to result in $$r + \frac{r!}{k!(r-k)!}$$

separate decodes.

3. The apparatus of claim 1, comprising the logic to:
add the one or more successful decodes of the ECC encoded data to a list; and
select a successful decode of the ECC encoded data from the list that has a closest Hamming distance to received data for which the ECC encoded data was encoded.

4. The apparatus of claim 1, comprising:
determine that the ECC encoded data has the plurality of bit errors and generate the ECC information to indicate the failure to correct one or more bit errors from the plurality of bit errors in the ECC encoded data.

5. The apparatus of claim 4, the failure to correct one or more bit errors from the plurality of bit errors in the ECC encoded data comprising the failure responsive to a die failure for a memory device in the memory system for which the ECC encoded data is stored in.

6. The apparatus of claim 5, the plurality of bits errors in the ECC encoded data is greater than 10 bits, where 10 bits is a number of bit errors an ECC used to encode the ECC encoded data is able to correct in the ECC encoded data.

7. The apparatus of claim 1, comprising an ECC used to encode the ECC encoded data to include one of a Reed-Solomon (RS) code or a binary Bose, Chaudhuri, and Hocquenghem (BCH) code.

8. The apparatus of claim 1, r bits is based on an amount of time to flip individual bit values for k bits and to cause the separate decodes of the ECC encoded data to be decoded following the flip is less than a threshold time.

9. The apparatus of claim 8, the threshold time based on a quality of service (QoS) requirement that includes time to correct bit errors before the plurality of bit errors in the ECC encoded data are deemed uncorrectable.

10. The apparatus of claim 1, the memory system includes non-volatile or volatile types of memory.

11. The apparatus of claim 10, the volatile types of memory comprises dynamic random access memory (DRAM).

12. The apparatus of claim 10, the non-volatile types of memory comprises 3-dimensional cross-point memory, flash memory, ferroelectric memory, silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire, electrically erasable programmable read-only memory (EEPROM), phase change memory, memristers or spin transfer torque—megnetorestive random access memory (STT-MRAM).

13. The apparatus of claim 12, the logic to identify the low confidence portion of the ECC encoded data comprises the logic to:
implement a first media read of the ECC encoded data at a first reference voltage;
implement a second media read of the ECC encoded data at a second reference voltage;
sort bits from the first and second media reads of the ECC encoded data based on probability of having an error; and
place r bits having the lowest probability of having error free bits in the low confidence portion of the ECC encoded data.

14. A method comprising:
receiving, at a controller for a memory system, error correction code (ECC) information for ECC encoded data stored in the memory system indicating a failure to correct one or more bit errors from a plurality of bit errors in the ECC encoded data;
identifying a low confidence portion of the ECC encoded data having a lowest probability of having error free bits compared to one or more other portions of the ECC encoded data, the low confidence portion including r bits;
flipping individual bit values for k bits of the r bits included in the low confidence portion;
decoding the ECC encoded data based on a combinatorial operation that results in a plurality of separate decodes of the ECC encoded data following the flipping of the individual bit values for k bits; and
determining that one or more separate decodes of the ECC encoded data were able to correct the plurality of bit errors and identifying decoded data for these one or more separate decodes as one or more successful decodes of the ECC encoded data.

15. The method of claim 14, the combinatorial operation that results in the plurality of separate decodes comprises the combinatorial operation to result in $$r + \frac{r!}{k!(r-k)!}$$

separate decodes.

16. The method of claim 14, comprising:
adding the one or more successful decodes of the ECC encoded data to a list; and
selecting a successful decode of the ECC encoded data from the list that has a closest Hamming distance to received data for which the ECC encoded data was encoded.

17. The method of claim 14, the memory system includes non-volatile types of memory that comprises 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM).

18. The method of claim 17, identifying the low confidence portion of the ECC encoded data comprises:
implementing a first media read of the ECC encoded data at a first reference voltage;
implementing a second media read of the ECC encoded data at a second reference voltage;
sorting bits from the first and second media reads of the ECC encoded data based on probability of having an error; and
placing r bits having the lowest probability of having error free bits in the low confidence portion of the ECC encoded data.

19. A system comprising:
one or more memory devices to store error correction code (ECC) encoded data;
a controller to execute logic, at least a portion of which is in hardware, the logic to:
receive ECC information for ECC encoded data stored in the one or more memory devices, the ECC information to indicate that a failure to correct one or more bit errors from a plurality of bit errors in the ECC encoded data;
identify a low confidence portion of the ECC encoded data that has a lowest probability of error free bits compared to one or more other portions of the ECC encoded data, the low confidence portion to include r bits;
flip individual bit values for k bits of the r bits included in the low confidence portion;
cause the ECC encoded data to be decoded based on a combinatorial operation that results in a plurality of separate decodes of the ECC encoded data following the flip of the individual bit values for k bits; and
determine that one or more separate decodes of the ECC encoded data were able to correct the plurality of bit errors and identify decoded data for these one or more separate decodes as one or more successful decodes of the ECC encoded data.

20. The system of claim 19, the combinatorial operation that results in the plurality of separate decodes comprises the combinatorial operation to result in $$r + \frac{r!}{k!(r-k)!}$$

separate decodes.

21. The system of claim 19, comprising the logic to:
add the one or more successful decodes of the ECC encoded data to a list; and
select a successful decode of the ECC encoded data from the list that has a closest Hamming distance to received data for which the ECC encoded data was encoded.

22. The system of claim 19, comprising the logic to:
determine that the ECC encoded data has the plurality of bit errors and generate the ECC information to indicate the failure to correct one or more bit errors from the plurality of bit errors in the ECC encoded data.

23. The system of claim 22, the failure to correct one or more bit errors from the plurality of bit errors in the ECC encoded data comprising the failure responsive to a die failure for at least one of the one or more memory devices for which the ECC encoded data is stored in.

24. The system of claim 19, the one or more memory devices includes non-volatile types of memory that comprises 3-dimensional cross-point memory, flash memory, ferroelectric memory, silicon-oxide-nitride-oxide-silicon (SONOS) memory, polymer memory, nanowire, ferroelectric transistor random access memory (FeTRAM or FeRAM), nanowire or electrically erasable programmable read-only memory (EEPROM).

25. The system of claim 24, the logic to identify the low confidence portion of the ECC encoded data comprises the logic to:
implement a first media read of the ECC encoded data at a first reference voltage;
implement a second media read of the ECC encoded data at a second reference voltage;
sort bits from the first and second media reads of the ECC encoded data based on probability of having an error; and
place r bits having the lowest probability of having error free bits in the low confidence portion of the ECC encoded data.

* * * * *